(12) United States Patent
Kuei

(10) Patent No.: US 7,705,350 B1
(45) Date of Patent: Apr. 27, 2010

(54) FRACTIONAL BIASING OF SEMICONDUCTORS

(76) Inventor: David Kuei, 6F, No. 1 Fu-Shing Street, Kaohsiung 80021 (TW)

( * ) Notice: Subject to any disclaimer, the term of this patent is extended or adjusted under 35 U.S.C. 154(b) by 265 days.

(21) Appl. No.: 11/199,985

(22) Filed: Aug. 8, 2005

Related U.S. Application Data

(62) Division of application No. 10/769,140, filed on Jan. 29, 2004, now Pat. No. 6,943,614.

(51) Int. Cl.
 *H01L 23/58* (2006.01)
 *H01L 29/10* (2006.01)
(52) U.S. Cl. ............... 257/48; 257/629; 257/901; 257/E29.002
(58) Field of Classification Search .............. 257/48, 257/629, 901, E29.002
 See application file for complete search history.

(56) References Cited

U.S. PATENT DOCUMENTS

| | | | | |
|---|---|---|---|---|
| 3,760,202 A * | 9/1973 | Kosonocky | ................. | 438/144 |
| 4,014,779 A | 3/1977 | Kuehnle | | |
| 4,134,124 A * | 1/1979 | Kane | ................ | 257/542 |
| 4,471,289 A | 9/1984 | Duley et al. | | |
| 4,814,288 A * | 3/1989 | Kimura et al. | ............. | 438/206 |
| 5,264,723 A * | 11/1993 | Strauss | ................... | 257/532 |
| 5,289,029 A * | 2/1994 | Nakashiba | ................ | 257/400 |
| 5,374,839 A * | 12/1994 | Jeon et al. | ................ | 257/372 |
| 6,018,177 A * | 1/2000 | Chi | ............................. | 257/303 |
| 6,048,746 A | 4/2000 | Burr | | |
| 6,049,479 A * | 4/2000 | Thurgate et al. | ........ | 365/185.18 |
| 6,087,892 A | 7/2000 | Burr | | |
| 6,091,283 A | 7/2000 | Murgula et al. | | |
| 6,184,548 B1 * | 2/2001 | Chi et al. | ................. | 257/301 |
| 6,188,234 B1 * | 2/2001 | Abadeer et al. | ............ | 324/766 |
| 6,218,708 B1 | 4/2001 | Burr | | |
| 6,303,444 B1 | 10/2001 | Burr | | |
| 6,330,190 B1 * | 12/2001 | Wang et al. | ............ | 365/185.28 |
| 6,489,224 B1 | 12/2002 | Burr | | |
| 6,906,953 B2 * | 6/2005 | Forbes | ................... | 365/185.03 |
| 7,115,427 B2 * | 10/2006 | Yang et al. | ................... | 438/22 |
| 2003/0012054 A1 * | 1/2003 | Kim | ........................ | 365/185.29 |
| 2004/0000692 A1 * | 1/2004 | Yamashita et al. | .......... | 257/365 |
| 2006/0076418 A1 * | 4/2006 | Ostertun et al. | ............ | 235/492 |
| 2006/0175656 A1 * | 8/2006 | Govoreanu et al. | ......... | 257/321 |
| 2006/0261404 A1 * | 11/2006 | Forbes | ....................... | 257/324 |

\* cited by examiner

*Primary Examiner*—Ngan Ngo

(57) ABSTRACT

A method and system of fractional biasing of semiconductors. A small negative voltage is applied to the back of a semiconductor wafer or device. An operating voltage is applied to the semiconductor. Operating characteristics of the semiconductor are enhanced by application of a fractional bias.

17 Claims, 3 Drawing Sheets

FRACTIONAL BIASING OF SEMICONDUCTORS

RELATED APPLICATIONS

This application is a divisional of and claims priority to U.S. patent Ser. No. 10/769,140 entitled "Fractional Biasing Of Semiconductors," by Kuei, filed on Jan. 29, 2004 now U.S. Pat. No. 6,943,614, which is incorporated herein by reference.

FIELD OF THE INVENTION

Embodiments of the present invention relate to the manufacture, test and operation of integrated circuits.

BACKGROUND

Semiconductor devices, e.g., digital logic integrated circuits are generally operated with a positive supply voltage. A ground reference (or ground return) is typically electrically coupled to the front or primary side of a semiconductor in a fashion similar to the coupling of a main operating voltage. Sometimes, the back or secondary side of a semiconductor is thermally coupled to a heat sink.

SUMMARY OF THE INVENTION

A method and system of fractional biasing of semiconductors are disclosed. A small negative voltage is applied to the back of a semiconductor wafer or device. An operating voltage is applied to the semiconductor. Operating characteristics of the semiconductor are enhanced by application of a fractional bias.

DETAILED DESCRIPTION OF THE INVENTION

Figure 1:
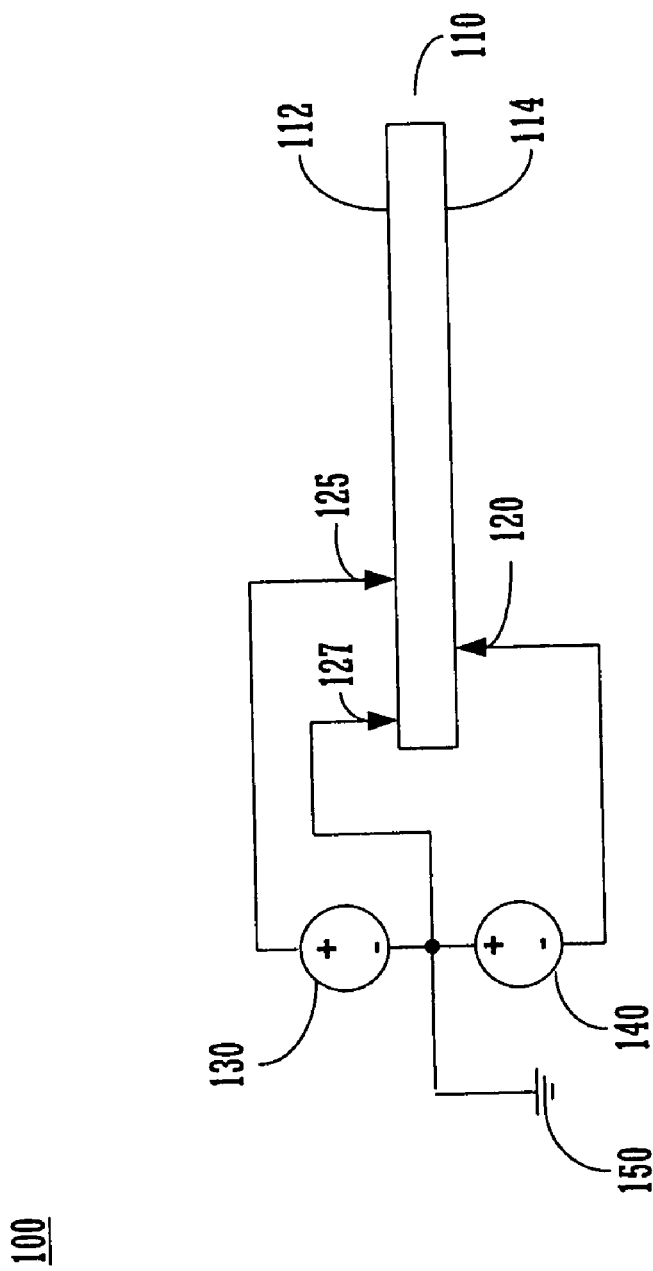
FIG. 1 illustrates an exemplary arrangement of coupling a semiconductor device to a negative voltage, according to an embodiment of the present invention.

In the following detailed description of the present invention, fractional biasing of semiconductors, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

NOTATION AND NOMENCLATURE

Some portions of the detailed descriptions which follow (e.g., processes 200 and 300) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions or firmware leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "accessing" or "indexing" or "processing" or "computing" or "translating" or "calculating" or "determining" or "selecting" or "storing" or "recognizing" or "generating" or "selecting" or "moving" or "encoding" or "combining" or "testing" of "setting" or "operating" or "transforming" or "determining" or "optimizing" or "synthesizing" or "grouping" or "estimating" or "describing" or "measuring" or "recording" or "associating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention are described in the context of design and operation of integrated semiconductors. More particularly, embodiments of the present invention relate to fractional biasing of semiconductors. It is appreciated, however, that elements of the present invention may be utilized in other areas of semiconductor operation.

Although the following description of embodiments in accordance with the present invention describes semiconductors formed in p-type materials, it is to be appreciated that symmetries with n-type materials are well known. For example, in general, exchanging p-type materials and processes with n-type materials and processes, and changing voltages from positive to negative can create symmetric structures and behaviors. Consequently, embodiments in accordance with the present invention are well suited to semiconductors formed in n-type materials, and such embodiments are considered within the scope of the present invention.

In the process of manufacturing a semiconductor, numerous well-known steps, for example, implantation, thermal annealing, oxide growth and photomask operations, are performed on a wafer. Initially, the wafer comprises a bulk material, for example silicon. The repeated actions of such well-known semiconductor processing upon a wafer generally produces a plurality of layers which constitute an integrated circuit. For the most part, these processing operations are performed on, or directed to, one side (or surface) of a wafer. This side is conventionally known as the "top" of a wafer. It is appreciated that sometimes operations are performed on the "bottom" of a wafer, e.g., lapping to reduce a wafer thickness. However, such "bottom side" processing is generally limited, and semiconductor devices are rarely constructed in or on the "bottom." Hereinafter, the term "primary" will be used to represent or describe that surface of a wafer conventionally known as the top surface; for example, it is that surface receiving substantial processing. The term "secondary" will represent or describe the other or bottom surface.

Conventionally, following a manufacturing process, a semiconductor wafer is tested. Testing typically involves placing a wafer in a test fixture. While in the test fixture, probe devices, or wafer probes, make contact with particular locations on a wafer. As a wafer typically comprises numerous instances of a semiconductor design, a set of probes is frequently assigned to each instance of the design.

Testing at the wafer level is generally intended to determine which instances of a semiconductor design on a wafer are likely to be functional and which instances are unlikely to perform correctly. A final determination of functionality may not be made until after further manufacturing steps, for example, cutting into individual die and final packaging. Wafer testing typically involves applying a series of electrical stimuli known as test vectors to particular points of an integrated circuit. Proper function may be observed by determining a series of voltages produced by the integrated circuit in response to the test vectors.

Wafer testing is valuable, in part, because the packaging process is expensive, in the form of packaging materials, operating expenses and capacity of process equipment. If a packaged semiconductor is determined to be non-functional after packaging, the expense of packaging is lost. In addition, certain aspects or nodes of a design may not be testable after packaging. For example, such points may only be available via pads that are generally not bonded out. Determining that a semiconductor is non functional, or likely to be non-functional, at the wafer level, prior to packaging, avoids such costs. Process yield at wafer test is an important metric of the manufacturing process and is often a critical factor in the commercial success of a product.

It is usually the case that all wafer probes contact the primary surface of a wafer. Some semiconductors are designed such that the secondary surface of the wafer (or die) should be grounded for operation. In such cases, it is well known to contact the secondary surface of a wafer under test in order to ground the wafer. It is to be appreciated however, that such ground connections are typically made to the primary side of a wafer, and coupled within the wafer to the substrate.

It is also known to couple the secondary surface of a wafer or die to ground during operation. Such couplings as back bonding or die bonding may couple a secondary surface of a wafer to ground as well as provide for thermal dissipation.

According to an embodiment of the present invention, the novel coupling of a small negative voltage of less than about 50 mV, for example, negative 15 mV, to the secondary side of a semiconductor device may beneficially improve the performance of the semiconductor device. For example, all instances (sites) of a design on a particular wafer may fail the wafer's test vectors in a conventional wafer test. When a slight negative voltage, or back bias, is applied to the secondary surface of the same wafer, all sites were observed to pass the same set of test vectors.

As a beneficial result of applying a small negative voltage to the secondary side of a wafer, yield at wafer test is advantageously increased.

It is generally the case that if an instance of a semiconductor design, or site, does not function (as determined by results of wafer test vectors) at wafer test, the site is discarded. For example, it may be marked, e.g., with ink dots, so as not to be used. Frequently, other sites from the wafer may pass wafer testing and proceed to other manufacturing steps. According to an embodiment of the present invention, sites that would have been discarded under the conventional art may now be beneficially used, resulting in increased process yields.

In a similar manner, packaged integrated circuits may demonstrate improved performance if a negative voltage is applied to the substrate. For example, if a packaged semiconductor does not pass its test vectors, the application of a negative voltage, e.g., negative 15 mV, has been demonstrated to beneficially cause the same device to pass the same vectors. Embodiments of the present invention are well suited to a variety of methods of coupling a negative voltage to a substrate, including coupling to the secondary side of the integrated circuit, back bonding, die bonding, and coupling a voltage to a substrate via conventional bonding pads on the primary surface of an integrated circuit.

The beneficial effects of small "fractional" biases applied to the secondary surface of a wafer are heretofore unreported. For example, conventional bias voltages applied to modern deep sub micron semiconductors could be in the range of 0.2 volts to 1.0 volts. A bias voltage of 1.0 volts can increase the threshold voltage by about 100 mV and reduce transistor leakage current by about a factor of 10. In comparison, a bias voltage that is a fraction of conventional bias voltages, e.g., 50 mV, would shift the same threshold voltage by only 5 mV and decrease leakage current by about 15%. Such changes are roughly equivalent to a 5 degree Celsius change in junction temperature. Conventionally, such small changes were not believed to be significant to the operation of semiconductors. Beneficial effects of fractional biases, e.g., a difference between functional and non functional integrated circuits, are surprising and novel.

FIG. 1 illustrates an exemplary arrangement 100 of coupling a semiconductor device to a negative voltage, according to an embodiment of the present invention. Wafer 110 comprises a bulk material, for example p-type silicon. Wafer 110 has been processed, e.g., implanted, doped, annealed, etc., to form a plurality of desirable semiconductor devices within and/or upon wafer 110. The repeated actions of such well-known semiconductor processing upon a wafer generally produces a plurality of layers which constitute an integrated circuit. Wafer 110 comprises a primary surface 112 which received substantially all such processing. Wafer 110 also comprises a secondary surface 114.

Wafer 110 is coupled to an operating voltage, e.g., 3.0 volts, generated by voltage source 130 via positive probe 125 on primary surface 112. Wafer 110 is coupled to a ground reference 150 through ground probe 127, typically disposed on primary surface 112. According to an embodiment of the present invention, performance characteristics of semiconductor devices of wafer 110 may be improved by coupling a negative voltage, e.g., minus 15 mV, generated by negative voltage source 140, via negative probe 120 to secondary surface 114. It is to be appreciated that embodiments of the present invention are well suited to other arrangements of coupling a negative voltage to a secondary surface of a semiconductor device. For example, a ground probe, e.g., ground probe 127, may be coupled to a secondary surface of a semiconductor device in accordance with embodiments of the present invention.

This novel coupling of a negative voltage to the secondary side of a semiconductor defines a bias to PN junctions and aligns charge carriers. For example, it defines an unambiguous state for electrical characteristics of a semiconductor. According to embodiments of the present invention, this biasing can produce heretofore unreported benefits in electrical operating characteristics of semiconductors.

In addition, novel coupling of a negative voltage to the secondary side of a semiconductor can also vacate depletion regions of semiconductor devices. Further, the threshold voltage of field effect transistors is increased, producing multiple beneficial effects, including an advantageous decrease in leakage current. Further still, parasitic field transistors under a field oxide can have their threshold voltage increased, beneficially reducing their deleterious effects upon an integrated circuit.

It is to be appreciated that embodiments of the present invention are also well suited to a symmetrical arrangement of materials and voltages. For example, a symmetric arrangement to that illustrated in FIG. 1 would show coupling a positive voltage to the secondary side of a wafer comprising n-type bulk material.

Figure 2:
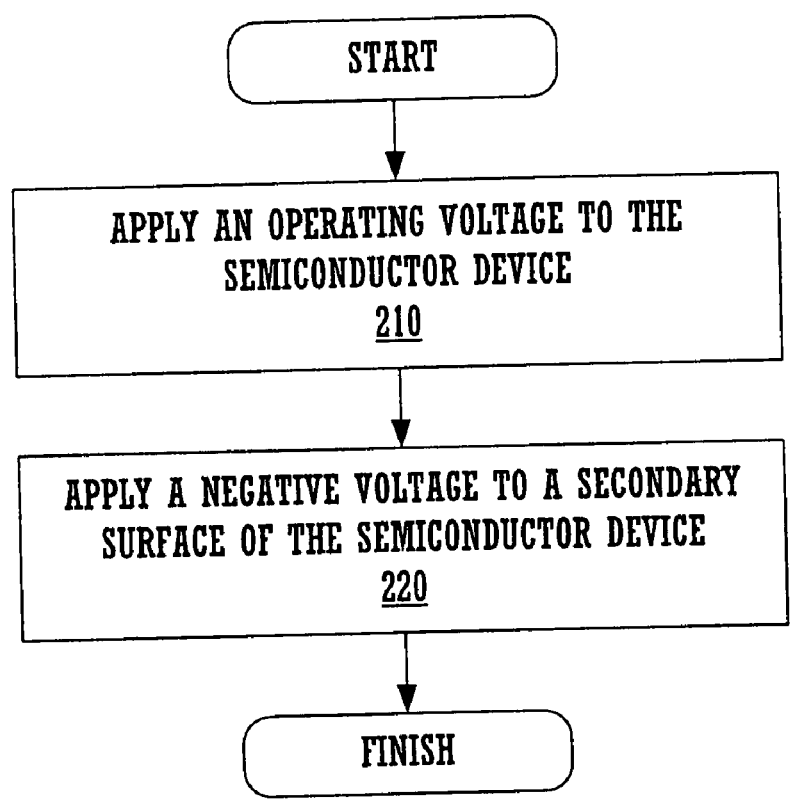
FIG. 2 illustrates a diagram of a method of operating a semiconductor device, according to an embodiment of the present invention.

FIG. 2 illustrates a diagram of a method 200 of operating a semiconductor device, according to an embodiment of the present invention.

In block 210, an operating voltage is applied to the semiconductor device. The operating voltage is frequently designated as Vss or Vcc. Such operating voltages are typically applied to metalized pads on the primary surface of a semiconductor. These pads may be coupled to external package pins, for example, via a wirebonded leadframe or tape automated bonding (TAB). Sometimes, solder bumps, e.g., controlled chip collapse connection ("C4"), are used to couple pads on the primary surface of a semiconductor to a higher level of packaging.

In block 220, a negative voltage is applied to a secondary surface of the semiconductor device. This voltage can have a very small magnitude, e.g., 15 mV. Embodiments of the present invention are well suited to a wide variety of couplings to a secondary surface of semiconductor devices, for example, back bonds and die bonds. Alternative embodiments of the present invention can also include bonding pads and solder bumps disposed on a secondary surface of semiconductor devices.

In this novel manner, electrical characteristics of a semiconductor can be enhanced. In some cases, such enhancement may be the difference between fully functional operation and failure of a semiconductor device. In such cases, embodiments of the present invention can beneficially increase process yield. In other cases, such enhancements can advantageously increase speed of operation and/or reduce power consumption.

Figure 3:
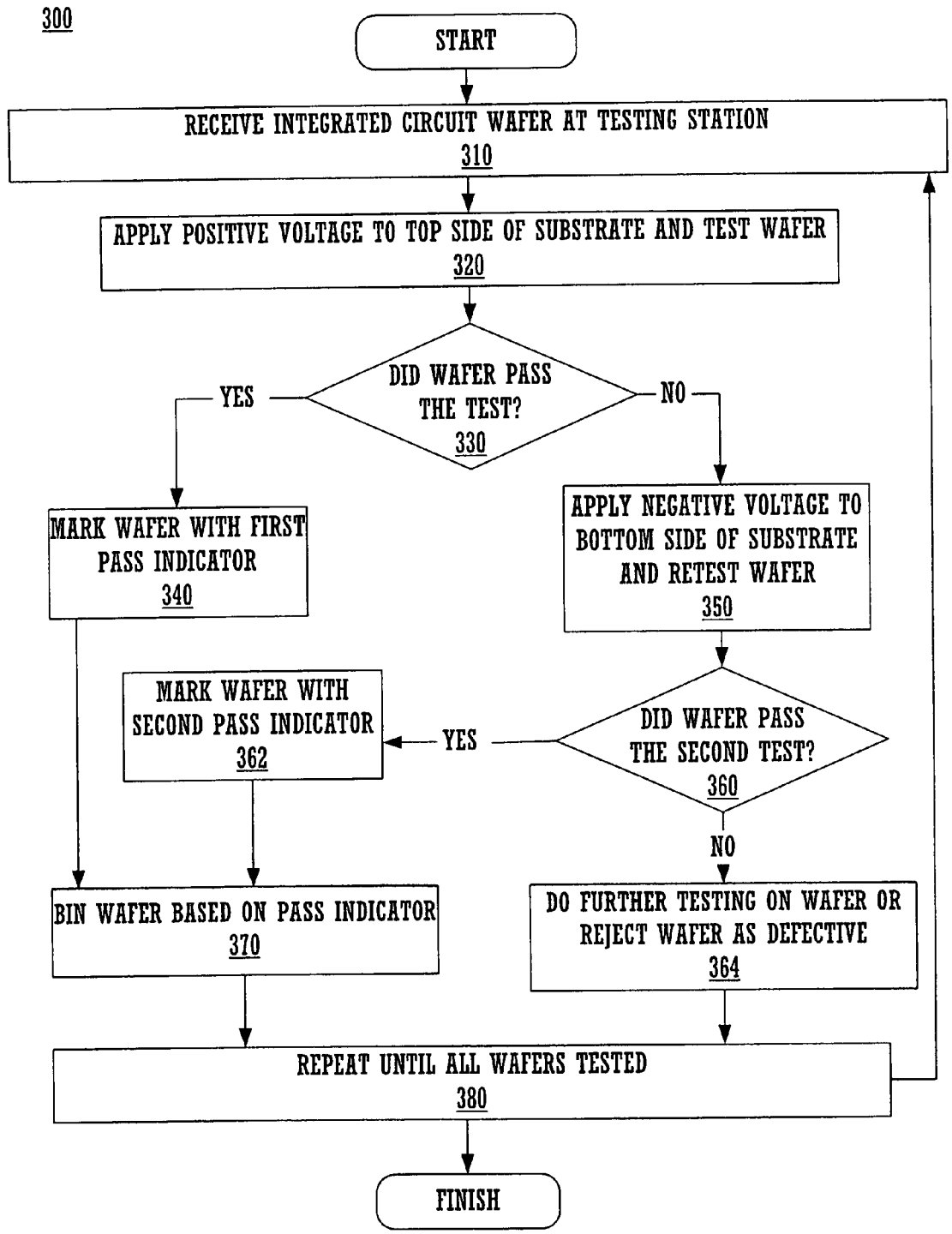
FIG. 3 illustrates a diagram of a method of testing a semiconductor wafer, according to an embodiment of the present invention.

FIG. 3 illustrates a diagram of a method 300 of testing a semiconductor wafer, according to an embodiment of the present invention. In optional block 310, an integrated circuit wafer is received at a testing station. The integrated circuit wafer has been processed through a variety of well-known semiconductor processing steps. A wafer testing station typically comprises equipment to handle a wafer, in addition to a plurality of wafer test probes.

In block 320, a positive voltage is applied to the top side of the substrate and the wafer is tested. Most integrated circuit devices utilize a positive operating supply voltage. An operating voltage is frequently applied to the top side of a wafer under test. Wafer test generally comprises applying an operating voltage and ground reference to a wafer. Wafer probes typically make contact with various points, e.g., test points, on the wafer. The probes usually excite test points with an electrical waveform. A series of such electrical waveforms is usually referred to as a set of test vectors. Some probes will typically measure a response of an integrated circuit to such test vectors.

In block 330, it is determined if the wafer passed the test. This is usually determined by comparing measured responses of a wafer with a set of expected responses for a set of test vectors. If the wafer passed the test, e.g., a set of responses to test vectors substantially matches a set of expected responses for a set of test vectors, process flow continues at optional bock 340. If the wafer did not pass the test, process flow continues at block 350.

If process flow continues at optional bock 340, the wafer is marked with a first pass indicator. A first pass indicator may be an ink mark, or an identifying number, e.g., a serial number, of the wafer may be recorded in a test database to indicate that the wafer has passed the first test.

After marking, in optional block 370 the wafer is "binned" or sorted based on the pass indicator. For example, the wafer may be placed into a grouping with an indication of when it passed the wafer test, e.g., on a first pass or on a second pass. It is to be appreciated that a wide variety of "binning" methods are well suited to embodiments in accordance with the present invention. For example, bins may represent a physical separation. Bins may also represent membership in a list stored in computer readable media.

If the wafer did not pass the test in block 330, control passes to block 350. In block 350, a negative voltage is applied to the bottom side of (the wafer's) substrate and the wafer is retested. The novel application of a negative voltage to the bottom, or back, side of a wafer has been shown to improve the wafer's operating characteristics.

In optional block 360, it is determined if the wafer passed the test. This determination may be made using substantially the same criteria as were used in block 330 (above). It is appreciated that embodiments in accordance with the present invention are well suited to the use of alternative criteria for passing. For example, the test vectors and/or the nature of the tests can be different in block 350 than in block 320. Additionally, more or less test or test sites may be required to pass in order for the wafer to be determined to pass the testing. If the wafer passed the test, e.g., a set of responses to test vectors substantially matches a set of expected responses for a set of test vectors, process flow continues at optional bock 362. If the wafer did not pass the test, process flow continues at optional block 364.

If the test of block 350 was passed, the wafer is marked with a second pass indicator in optional block 362. If the test was not passed, control passes from block optional 360 to optional block 364. In optional block 364 further testing can be performed on the wafer or various sites of the wafer, e.g., to determine a cause of failure, or the wafer can be rejected as defective.

Process control from either optional block 370 or optional block 364 passes to optional block 380. In optional block 380 the previous steps are repeated until all wafers, e.g., of a production lot, have been tested.

The preferred embodiment of the present invention, fractional biasing of semiconductors, is thus described. While the present invention has been described in particular embodiments, it should be appreciated that the present invention should not be construed as limited by such embodiments, but rather construed according to the below claims.

What is claimed is:
1. A semiconductor device comprising:
   a primary surface of bulk material coupled to a supply voltage source through a positive and a negative terminal of the supply voltage source, wherein the negative terminal is also coupled to ground;
   a back surface of the bulk material substantially parallel to the primary surface, wherein the back surface is configured to receive a fractional negative voltage as a body bias and wherein the fractional negative voltage is a fraction of a standard bias voltage;

a voltage source that is coupled to the semiconductor device to supply the fractional negative voltage; and a coupling for conducting the fractional negative voltage to the back surface wherein the fractional negative voltage is less than about 50 millivolts in magnitude.

2. The semiconductor device of claim 1 wherein the bulk material is silicon.

3. The semiconductor device of claim 2 wherein the silicon comprises a plurality of layers which constitute an integrated circuit.

4. The semiconductor device of claim 1 further comprising circuitry to generate the fractional negative voltage.

5. The semiconductor device of claim 1 wherein the fractional negative voltage is generated external to the semiconductor device.

6. The semiconductor device of claim 1 wherein the bulk material is silicon, and the silicon comprises a plurality of layers which constitute an integrated circuit.

7. A device comprising:
a primary surface of a substrate comprising an integrated circuit and coupled to a supply voltage source through a positive and a negative terminal of the supply voltage source, wherein the negative terminal is also coupled to ground;
a back surface of the substrate substantially opposed to the primary surface, wherein the back surface is configured to receive a fractional negative voltage as a body bias and wherein the fractional negative voltage is a fraction of a standard bias voltage;
a coupling for conducting the fractional negative voltage to the back surface; and
a voltage source to supply the fractional negative voltage wherein the fractional negative voltage is less than about 50 millivolts in magnitude.

8. A device comprising:
a primary surface of a substrate comprising an integrated circuit that receives an operating voltage from a supply voltage source that comprises a positive and a negative terminal wherein the positive and the negative terminal are coupled to the primary surface of the substrate and the positive terminal is also coupled to ground, and wherein the primary surface is configured to receive a negative operating voltage for the integrated circuit;
a second surface of the substrate substantially opposed to the primary surface of the substrate, wherein the second surface is configured to receive a fractional positive voltage as a body bias and wherein the fractional positive voltage is a fraction of a standard bias voltage;
a voltage source that is coupled to the device to supply the fractional positive voltage; and
a coupling for conducting the fractional positive voltage to the second surface wherein the fractional positive voltage is less than about 50 millivolts in magnitude.

9. The device of claim 7 wherein the substrate is silicon.

10. The device of claim 9 wherein the silicon comprises a plurality of layers which constitute the integrated circuit.

11. The device of claim 7 wherein the fractional negative voltage is generated external to the semiconductor device.

12. The device of claim 8 wherein the substrate is silicon.

13. The device of claim 8 wherein the silicon comprises a plurality of layers which constitute the integrated circuit.

14. The device of claim 8 wherein the fractional negative voltage is generated external to the semiconductor device.

15. A method comprising:
supplying respective voltages from a positive and a negative terminal of a first voltage source to a primary surface of semiconductor bulk material wherein the positive and the negative terminal of the first voltage source are coupled to the primary surface of the bulk material and the negative terminal of the first voltage source is also coupled to ground; and
supplying a fractional negative voltage of less than 50 millivolts as a body bias to a back surface of the semiconductor bulk material from a negative terminal of a second voltage source, wherein the back surface of the semiconductor bulk material is substantially parallel to the primary surface.

16. The method of claim 15 further comprising measuring a response of said semiconductor bulk material to the supplying respective voltages and the supplying the fractional negative voltage.

17. The method of claim 16 further comprising determining if an integrated circuit associated with the bulk material is operating properly by comparing the response with an expected response.

* * * * *